US006917233B1

(12) United States Patent
Waffaoui El

(10) Patent No.: US 6,917,233 B1
(45) Date of Patent: Jul. 12, 2005

(54) LIMITING AMPLIFIER AND METHOD FOR AMPLIFYING AN INPUT SIGNAL

(75) Inventor: Rachid Waffaoui El, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/657,428

(22) Filed: Sep. 8, 2003

(30) Foreign Application Priority Data

Sep. 11, 2002 (EP) .............................. 02078719

(51) Int. Cl.[7] .............................................. H03L 5/00
(52) U.S. Cl. ..................................... 327/306; 327/309
(58) Field of Search ............................. 327/52, 54, 58, 327/62, 91, 96, 305, 309–310, 312, 560–561, 563; 330/9

(56) References Cited

U.S. PATENT DOCUMENTS

| | | | |
|---|---|---|---|
| 5,798,664 A | 8/1998 | Nagahori et al. | 327/307 |
| 5,955,918 A | 9/1999 | Uno | 330/9 |
| 6,275,541 B1 * | 8/2001 | Nagahori et al. | 375/318 |
| 6,292,058 B1 * | 9/2001 | Ide et al. | 330/279 |
| 6,304,357 B1 * | 10/2001 | Ohhata et al. | 398/209 |
| 6,657,488 B1 * | 12/2003 | King et al. | 330/9 |

FOREIGN PATENT DOCUMENTS

EP 0837570 4/1998 ......... H04B/10/158

* cited by examiner

Primary Examiner—My-Trang Nu Ton
(74) Attorney, Agent, or Firm—Adam L. Stroud

(57) ABSTRACT

Disclosed is a limiting amplifier for amplifying an input signal including at least first portions having a first amplitude and second portions having a second amplitude being lower than said first amplitude. The amplifier includes a first peak detector for detecting the current maximum value in the input signal. The amplifier also includes a second peak detector for detecting the current minimum value in the input signal. The amplifier also includes determining means for providing a first decision that a variation in the input signal is due to a variation in a first amplitude and/or a second amplitude, or a second decision that a variation in the input signal is due to a transition from a first portion to a second portion, a third decision that a variation in the input signal is due to a transition from a second portion to a first portion, and controlling meats for either activating or inactivating one of the decreasing means and the increasing means based on the decision.

12 Claims, 10 Drawing Sheets

LIMITING AMPLIFIER AND METHOD FOR AMPLIFYING AN INPUT SIGNAL

The present invention relates to a limiting amplifier and a method for amplifying an input signal including at least first portions having a first amplitude and second portions having a second amplitude being lower than said first amplitude, in particular digital signals comprising "one" and "zero" portions wherein the first portions are the "one" portions and the second portions are the "zero" portions.

Such an amplifier and such a method are particularly used for burst-mode receivers in an asynchronous transfer mode passive optical network (ATM-PON). An asynchronous transfer mode passive optical network (ATM-PON) is one of the best means to meet the increasing demand for the construction of a broadband access network with regard to bandwidth and cost. At the same time, the need for low-cost and high-speed burst-mode integrated circuits is increasingly growing.

FIG. 1 shows the block diagram of an optical fiber transceiver. A limiting amplifier LA is needed to amplify the small signal delivered by a transimpedance amplifier TIA to about 200 mV single-ended required by a clock and data recovery CDR.

If AC(alternating current) coupling between the transimpedance amplifier TIA and the limiting amplifier LA in a multi-chip design can be permitted, the system designer has no longer to be concerned about the common-mode voltages at the interface between the two integrated circuits, or about the offset in the transimpedance amplifier TIA. The disadvantage of the AC-coupling is that the low-frequency components of the signal cannot be passed resulting in DC (direct current)-wander.

Compared to the spectrum of a SONET/SDH data stream, the spectrum of an ATM-PON data stream contains much more energy at low-frequencies due to the following reasons:

No DC-balanced code is used in the ATM-PON standard. Only the bursts (not the overhead bytes) are scrambled in the ATM-PON standard; this means that the mark density (number of "one"-bits divided by all bits) of the total burst signal is still different from 50%. The mark density of a burst signal depends also on the burst activity: If the activity is high, it may be close to the hallway point between zero and one levels; if the activity is low, the average comes close to zero level. Finally, the bursts arrive at the receiver with varying amplitude due to the fact that the transmitters are situated at different distances from the receiver and the data stream at the receiver side is amplitude-modulated.

FIG. 2 illustrates the shape of such burst signal. The optical signal arrives at the receiving side in burst-mode having varying amplitude P1 and P2, with small separation between the packets 1 and 2, superimposed on a low frequency background light. The signal is not DC-balanced. The receiver should deliver a digital bit stream.

FIG. 3 shows the eye diagram of a 1 Gb/s Non-Return-to-Zero (NRZ) data stream passed through a high-pass filter with a frequency cut-off of 100 kHz. The input data stream (/Vdata) has a negative digital sum (long sequences of zeros). The data stream at the output of the filter (/Vcrl) has been shifted far from the zero-level decision threshold and it suffers also from severe DC-wander. Further, the signal at the output of the limiting amplifier LA suffers from severe duty cycle distortion (DCD) and jitter.

In the following, it is shown that in a receiver data depended jitter is caused by a low-frequency cut-off and is a function of the digital sum n of the input signal.

Assuming a linear system with a single-pole $F_{LF}$ high-pass transfer function, the voltage drift at the output caused by n "zeros" or "ones" at the input of the linear system is:

$$v_{drift} = \frac{v^{pp}}{2}\left(1 - \exp\left(-2\pi|n|\frac{F_{LF}}{B}\right)\right) \quad (1)$$

$$n = \sum_i D_i \text{ with } D_i = 1 \text{ or} -1 \quad (2)$$

wherein $D_i$ is the input data stream, and B is the bit rate.

$$v_{drift} \approx \frac{v^{pp}}{2} 2\pi|n|\frac{F_{LF}}{B} \quad (3)$$

Now, if this signal is applied to the limiting amplifier LA, the peak jitter at the output of the limiting amplifier LA can be expressed as:

$$\tau_j^p = v_{drift}\frac{t_r}{0.6v^{pp}} \quad (4)$$

$$\tau_j^p[UI] = 1.66\pi \cdot F_{LF} \cdot |n| \cdot t_r \quad (5)$$

where $t_r$ is the 20%–80% rise/fall time of the received signal. For a first order system, $t_r$ is related to the bandwidth BW of the receiver via the following relation:

$$t_r = \frac{\ln(4)}{2\pi}\frac{1}{BW} = \frac{0.22}{BW} \quad (6)$$

In some applications, the receiver should have at least a second order transfer function in order to achieve a finite second order noise bandwidth.

The receiver bandwidth BW is related to the bit rate B via the following relation:

$$BW = \frac{2}{3}B \quad (7)$$

Relation (7) is the result of a compromise between noise and inter-symbol interference (ISI) in the receiver.

Now, equation (5) can be expressed as a function of low frequency cut-off $F_{LF}$ to the bit rate ratio using equation (6) and equation (7):

$$\tau_j^p[UI] = 0.55\pi \cdot |n| \cdot \frac{F_{LF}}{B} \quad (8)$$

Accordingly, as shown above, the data dependant jitter is proportional to the digital sum n of the input data stream $D_i$.

EP 0 837 570 A2 discloses an optical receiver which is capable of responding to both burst and continuous signals and can operate in response to an input optical signal to produce an output electrical signal. The optical receiver comprises a photo diode for transducing the input optical signal into an electrical signal, a plurality of limit amplifier circuits which are connected in series to one another and which have offset compensation functions determined by controllable offset compensation time constants, respectively. The plurality of limit amplifier circuits amplifies the electrical signal to produce an amplified and controlled electrical signal in dependency upon the offset compensation time constants controlled. The optical receiver further comprises adjusting circuits connected to the limit amplifier circuits for adjusting at least one of the offset compensation time constants to make the limit amplifier circuits produce the amplified and controlled electrical signal and an output terminal for producing the amplified and controlled electrical signal as the output electrical signal.

U.S. Pat. No. 5,798,664 A discloses an optical receiver, wherein an offset cancelling amplifier comprises a limiting amplifier for amplifying an input signal while preventing amplified amplitude from exceeding a predetermined level to provide an output signal, an offset detector for detecting an offset in the output signal to produce a detection signal representative of the offset amount detected, and an offset controller coupled in the input circuit of the limiting amplifier and the offset detector for controlling an input voltage of the limiting amplifier in response to the detection signal to reduce the offset in the output signal. In order to widen the dynamic range and lower the low-frequency cut-off of the offset cancelling amplifier, the offset detector comprises a Miller integrator.

U.S. Pat. No. 5,955,918 A discloses a burst mode digital data amplifier circuit unit which is composed of an offset compensation circuit for equalizing and issuing a DC (direct current) potential in data input period of one input signal of differential input signals, and a DC potential in data input period of other input signal, and an amplitude limiting amplifier circuit for receiving a differential output signal from this offset compensation circuit as an input signal, and issuing to a differential output terminal as a differential output signal kept in a constant output signal amplitude while amplifying in a linear region. This amplifier circuit unit is connected in cascade in plural stages as required, and is applied to an amplifier circuit of an optical receiving circuit and others.

However, the above mentioned devices of the prior art are not provided or not suitable to minimize or suppress the data dependant jitter at the output of a limiting amplifier and in particular of an AC-coupled limiting amplifier.

It is therefore an object of the present invention to provide a limiting amplifier and method for amplifying an input signal which amplifier and method are able to minimize data dependant jitter in a satisfying manner.

In order to achieve the above and further objects, in accordance with a first aspect of the present invention, there is provided a limiting amplifier for amplifying an input signal including at least first portions having a first amplitude and second portions having a second amplitude being lower than said first amplitude, in particular digital signals comprising "one" and "zero" portions wherein the first portions are the "one" portions and the second portions are the "zero" portions, said amplifier comprising:

a first peak detecting means for detecting the current maximum value in the input signal, said first peak detecting means comprising first holding means for storing the currently detected maximum value if it is higher than the previous stored value and decreasing means for decreasing the stored value in said first holding means if said first amplitude is lower than said stored value, and a second peak detecting means for detecting the current minimum value in the input signal, said second peak detecting means comprising second holding means for storing the detected minimum value if it is lower than the previously stored value and increasing means for increasing the stored value in said second holding means if said second amplitude is higher than said stored value;

determining means for providing a first decision that a variation in the input signal is due to a variation in said first amplitude and/or second amplitude, or a second decision that a variation in the input signal is due to a transition from a first portion to a second portion, or a third decision that a variation in the input signal is due to a transition from a second portion to a first portion; and controlling means for inactivating said decreasing means and said increasing means if said determining means provides said first decision, for activating said decreasing means if said determining means provides said second decision, or for activating said increasing means if said determining means provides said third decision.

In accordance with a second aspect of the present invention, there is provided a method for amplifying an input signal including at least first portions having a first amplitude and second portions having a second amplitude being lower than said first amplitude, in particular digital signals comprising "one" and "zero" portions wherein the first portions are the "one" portions and the second portions are the "zero" portions, said method comprising the steps of:

detecting the current maximum value in the input signal wherein the currently detected maximum value is stored if it is higher than the previous stored value and said stored value is decreased if said first amplitude is lower than said stored value, and detecting the current minimum value in the input signal wherein the detected minimum value is stored if it is lower than the previously stored value and said stored value is increased if said second amplitude is higher than said stored value;

providing a first decision that a variation in the input signal is due to a variation in said first amplitude and/or second amplitude, or a second decision that a variation in the input signal is due to a transition from a first portion to a second portion, or a third decision that a variation in the input signal is due to a transition from a second portion to a first portion; and inactivating said decreasing means and said increasing means if said determining means provides said first decision, activating said decreasing means if said determining means provides said second decision, or activating said increasing means if said determining means provides said third decision.

The advantage of the present invention is that data dependant jitter can be minimized or suppressed at the output of the limiting amplifier. This is achieved by that the limiting amplifier has to decide whether the input signal variation is due to a transition in the data stream, a variation in the amplitude of a first portion ("one" portion in case of a digital signal) or a variation in the amplitude of a second portion ("zero" portion in case of a digital signal). This means that the limiting amplifier makes correct decisions despite of DC-wander caused by AC-coupling and despite of variations in the power of the input signal. So, the present invention is particularly very suitable for AC-coupled limiting amplifiers used for burst mode receivers in an asynchronous transfer mode passive optical network (ATM-PON).

Further advantageous embodiments are defined in the dependent claims.

Preferably, in the first peak detecting means the first holding means comprises a first capacitor, and the decreasing means is provided for discharging said first capacitor and particularly comprises a first current source connected in parallel to said first capacitor.

According to a further embodiment, in the second peak detecting means (which may also be called background detecting means or minimum detector) the second holding means comprises a second capacitor, and the increasing means is provided for charging said second capacitor and particularly comprises a second current source connected in series to said second capacitor.

So, newly developed decision-based signal peak and original background detectors are provided in the above mentioned preferred embodiments.

In a still further embodiment, a threshold generating means is provided for generating a first threshold value, a second threshold value and a third threshold value, wherein said first threshold value is higher than said second threshold value and said second threshold value is higher than said third threshold value, and said determining means provides said first decision if the current value of the input signal is higher than said first threshold value or lower than said third threshold value, or said second decision if the current value of the input signal is lower than said first threshold value and higher than said second threshold value, or said third decision if the current value of the input signal is lower than said second threshold value and higher than said third threshold value. Preferably, the threshold generating means is provided for, in particular continuously, adapting the first, second and/or third threshold values in accordance with the results of said first and second peak detecting means. In particular, the threshold generating means is provided for generating said first threshold value $V_H$, said second threshold value $V_0$, and said third threshold value $V_L$ as function of the value $V_p$ stored in said first holding means and the value $V_b$ stored in said second holding means as follows:

$$V_H = \beta V_p; \frac{V_0}{V_p} < \beta < 1 \tag{10}$$

$$V_L = \gamma V_b; 1 < \gamma < \frac{V_0}{V_b} \tag{11}$$

wherein α, β and γ are constants which are chosen as function of the noise in said first and second portions of the input signal.

Hence, the limiting amplifier of the present invention has adaptive decision thresholds to cope with DC-wander caused by AC-coupling and with variations in signal power or background level ("zero"-level in case of a digital signal). The threshold levels are continuously adapted to the input signal via a first feedback signal controlling the first current source of the first peak detecting means and via a second feedback signal for controlling the second current source of the second peak detecting means. After all, the present invention results in superior data dependant jitter performance when compared to a fixed decision threshold limiting amplifier of the prior art.

The above described objects and other aspects of the present invention will be better understood by the following description and the accompanying figures, in which.

The limiting amplifier according to a preferred embodiment of the present invention makes use of a decision-based signal-peak detector and a decision based signal-background (signal-bottom) detector. These two detectors detect the peak-value and the bottom-value of the input signal, bit per bit.

Figure 1:
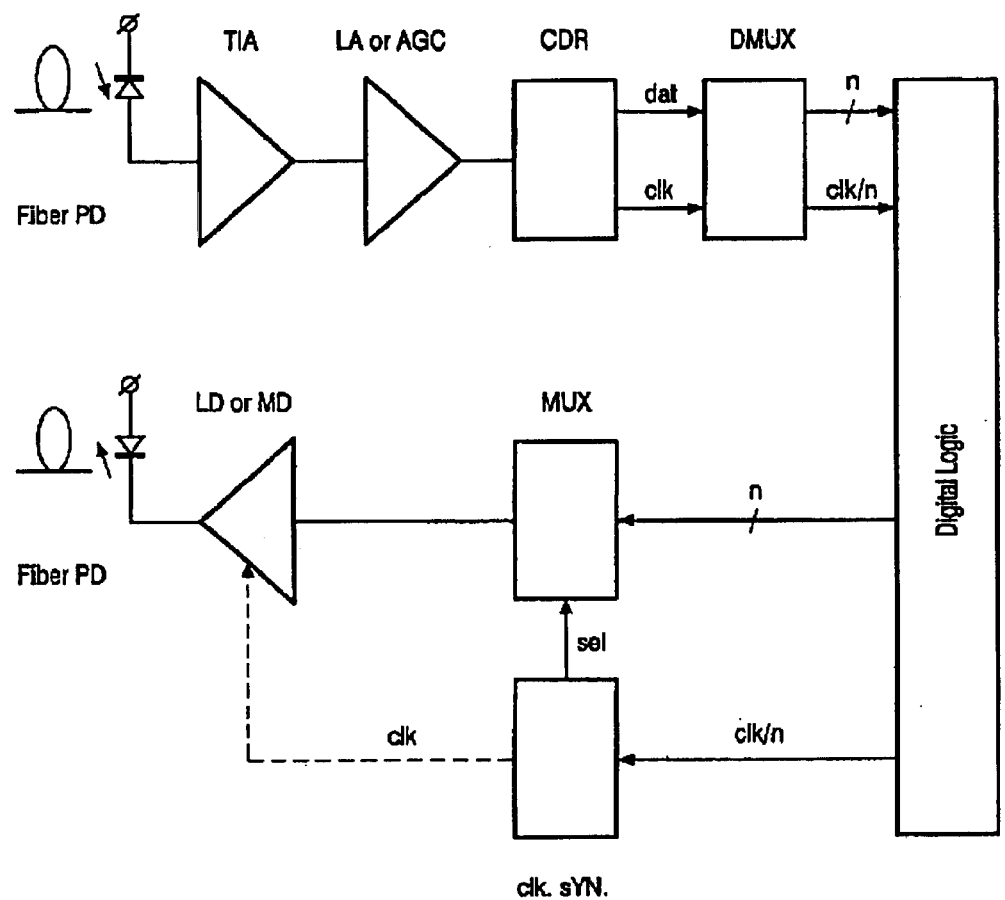
FIG. 1 is a schematic block diagram of an optical fiber transceiving system.
Figure 2:
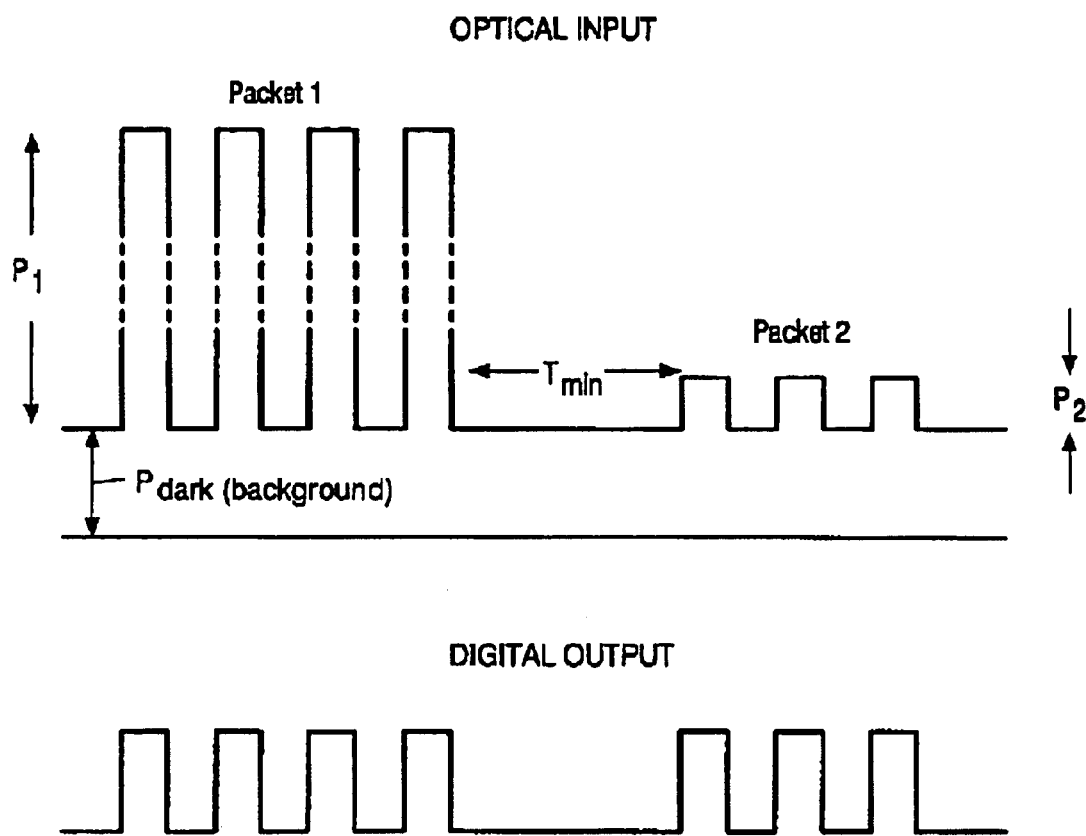
FIG. 2 shows the waveform of an optical and a digital burst-mode signal.
Figure 3:
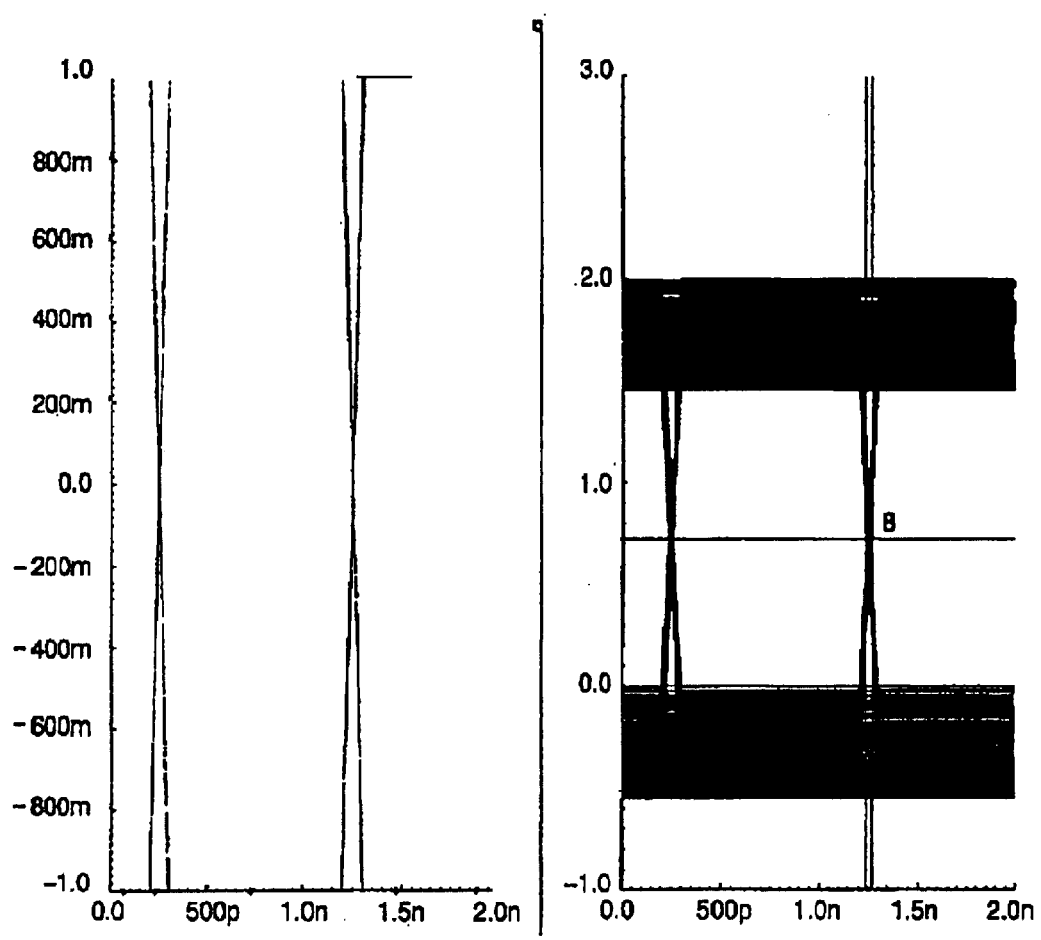
FIG. 3 shows the waveform of a data dependent jitter caused by low-frequency cut-off at the receiving side.
Figure 4:
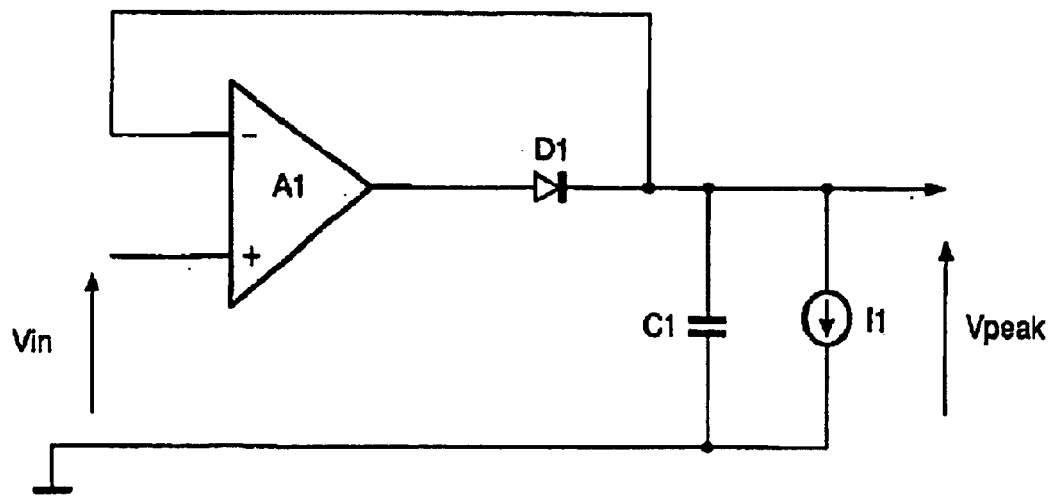
FIG. 4 shows the circuit of a conventional peak detector.

FIG. 4 shows a conventional peak detector. A current source I1 has been coupled in parallel to a capacitor C1 in order to discharge the capacitor C1 if the amplitude of the input signal is lower than the currently detected peak-value. This will help to follow the envelope of the input signal. However, this peak-detector cannot distinguish between a "one" with a lower amplitude and a "zero". If a "one" pulse is followed by a long sequence of "zeros", the capacitor will be discharged, introducing an error on the slice level of the limiting amplifier.

Figure 5:
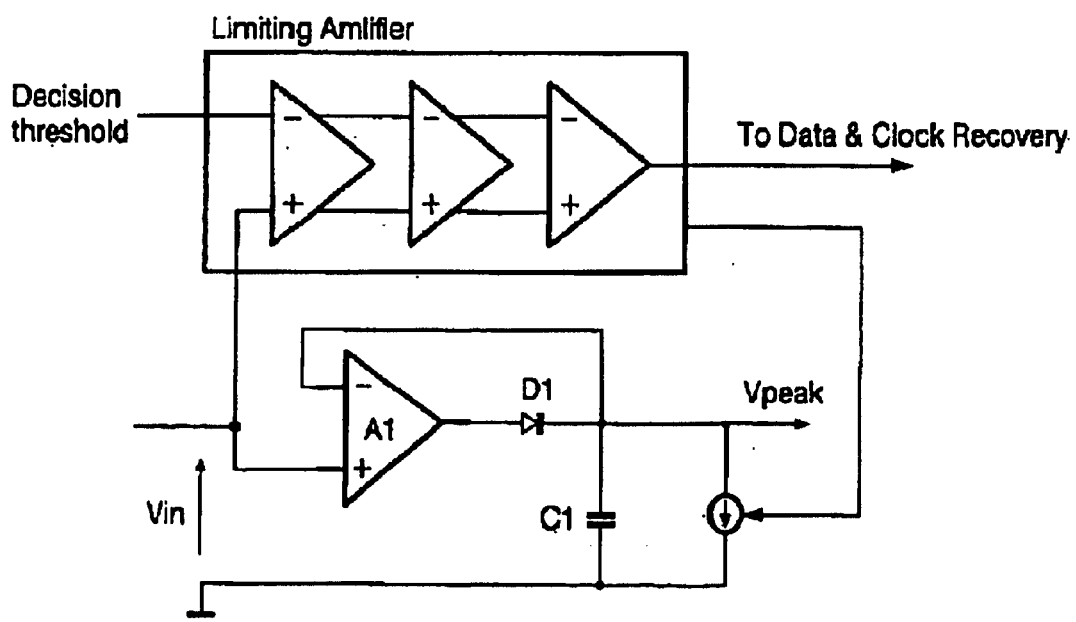
FIG. 5 shows the circuit of a decision based signal-peak detector according to a preferred embodiment of the present invention.
Figure 6:
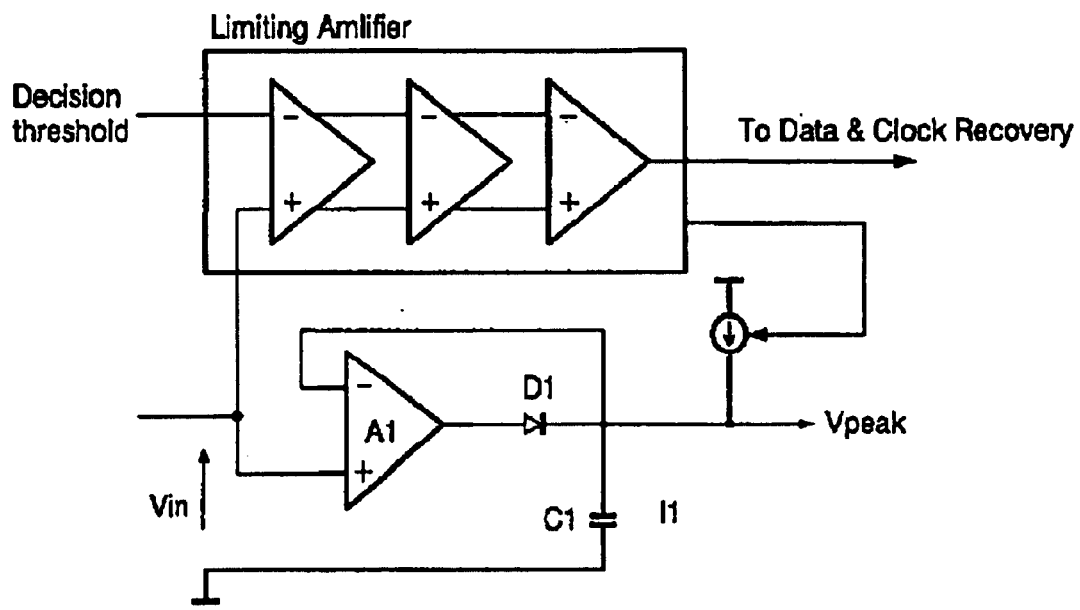
FIG. 6 shows the circuit of a decision based signal-background detector according to a preferred embodiment.

The decision-based signal-peak detector according to a preferred embodiment of the present invention does not suffer from this limitation and makes use of the decision in the limiting amplifier in order to control the current source I1 as shown schematically in FIG. 5. FIG. 6 shows a decision-based signal-background detector according to a preferred embodiment of the present invention wherein the current source is serially connected to the capacitor C1 in order to charge the capacitor C1 if the amplitude of the input signal is higher than the currently detected peak-value.

The limiting amplifier has to decide whether the input signal variation is due to a transition in the data stream, a variation in the amplitude of a "one", and a variation of the amplitude of a "zero".

Figure 7:
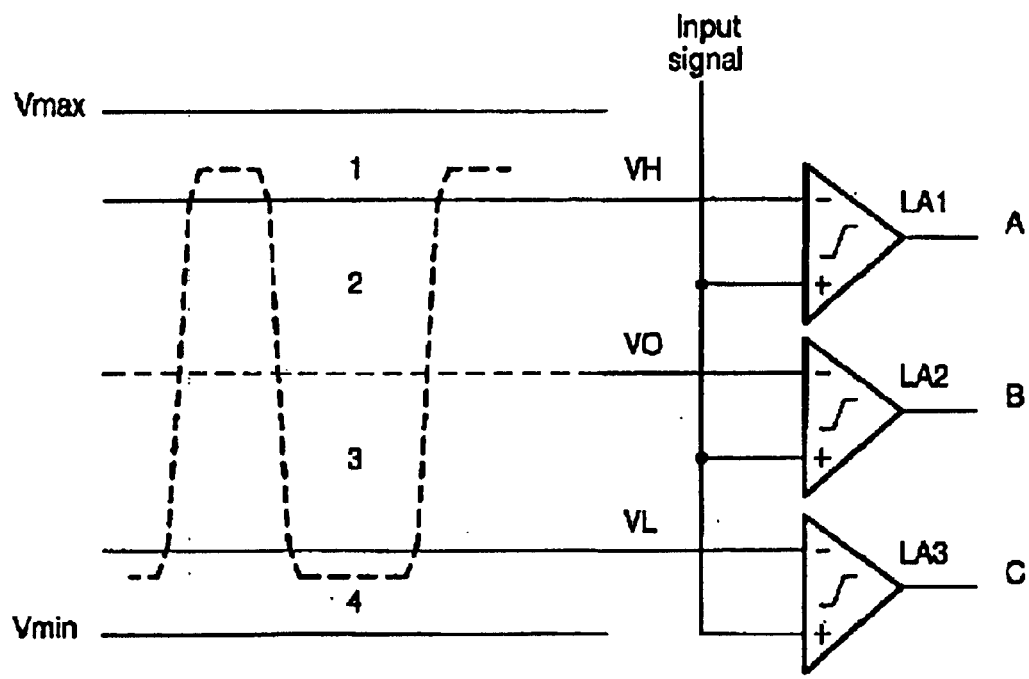
FIG. 7 shows the input signal quantization by means of a three-bit A/D converter according to a preferred embodiment of the present invention.

To do that, the input signal range is divided into 4 regions as shown in FIG. 7.

These regions are defined by three thresholds $V_H$, $V_0$, $V_L$ which are continuously adapted as a function of the signal-peak value $V_p$ generated by the decision-based signal-peak detector of FIG. 5 and signal-background value $V_b$ generated by the decision-based signal-background detector of FIG. 6, according to relations (9, 10, 11) that a re-written for simplicity:

$$V_H = \beta V_p; \frac{V_0}{V_p} < \beta < 1 \qquad (10)$$

$$V_L = \gamma V_b; 1 < \gamma < \frac{V_0}{V_b} \qquad (11)$$

The constants α, β, γ are chosen as a function of the noise on "zeros" and the noise on "ones" in the receiver.

The input signal is allowed to be in region 2 and region 3 (cf. FIG. 7) only during the transitions. The input signal is compared to the $V_H$, $V_0$, $V_L$ thresholds by means of three comparators together forming a 3-bit A/D converter. This results in three digital signals A, B, and C.

Figure 8:
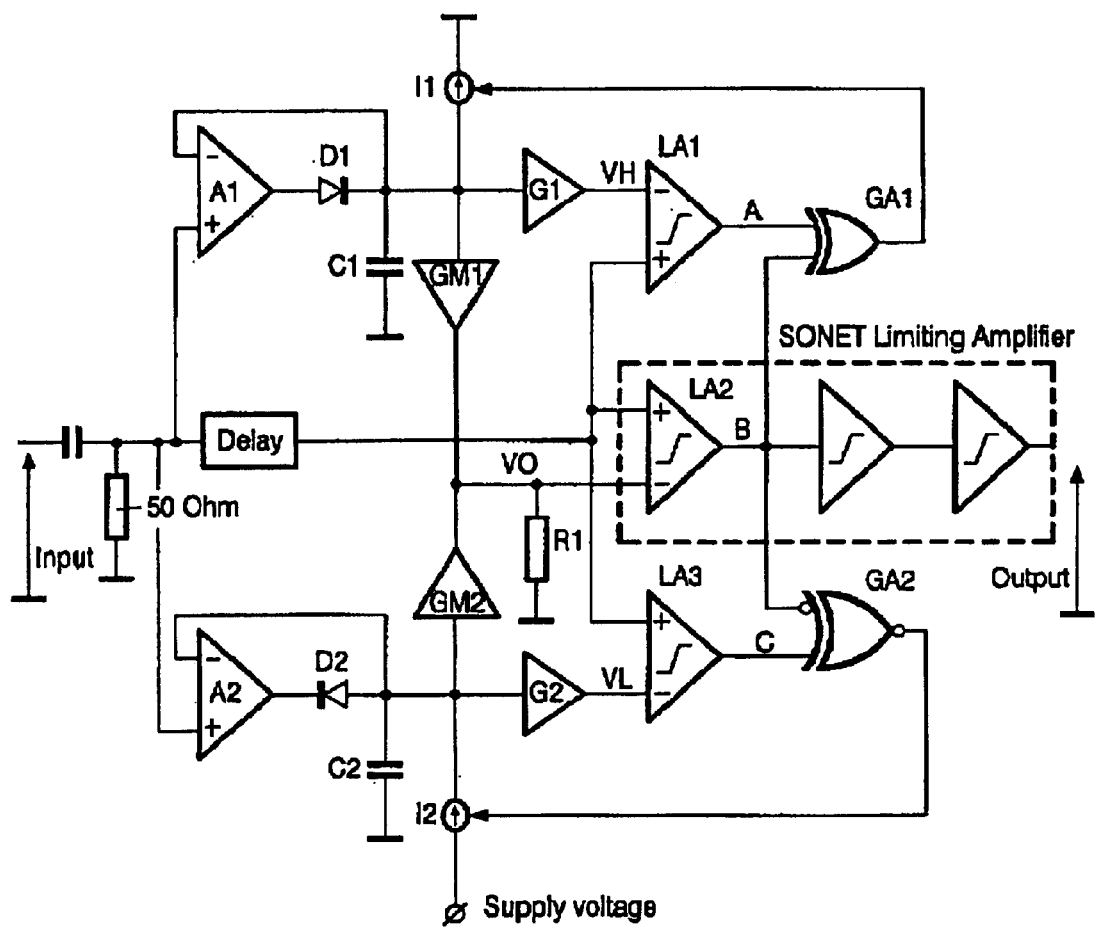
FIG. 8 shows the circuit of a limiting amplifier according to a first preferred embodiment of the present invention.

The block diagram of a complete limiting amplifier according to a first preferred embodiment of the present invention is shown in FIG. 8, wherein the signal-peak detector comprises a first operational amplifier A1, a first diode D1 coupled in flow direction to the output of the operational amplifier A1, a first capacitor C1 connected to ground and a first current source I1 coupled in parallel to the first capacitor C1, and the signal-background comprises a second operational amplifier A2, a second diode D2 connected in reverse direction to the output of the second operational amplifier A2, a second capacitor C2 connected to ground and a second current source I2 serially connected to the second capacitor C2. The decision threshold $V_0$ is generated by means of transconductances $g_{m1}$, $g_{m2}$ and a resistor R1. The decision thresholds $V_H$ and $V_L$ are generated by means of amplifiers G1 and G2 respectively. The first current source I1 is controlled by comparators LA1 and LA2, and an EXOR gate GA2. The second current source I2 is controlled by comparators LA2 and LA3, and an EXNOR gate GA2.

The input signal position can be tracked by looking to A⊕B and $$\overline{C \oplus \overline{B}}$$

signals according to the following table:

| A ⊕ B | $\overline{C \oplus \overline{B}}$ | Action |
|---|---|---|
| 0 | 0 | No action |
| 0 | 1 | The input signal wanders-up, The capacitor C2 should be charged |
| 1 | 0 | The input signal wanders-down, The capacitor C1 should be discharged |
| 1 | 1 | Not possible, loss of signal (the received optical power is too small) |

The input signal is delayed by a delay circuit (block "Delay" in FIG. 8) before being applied to the comparators LA1, LA2, LA3. This delay should be matched to the delay in the signal-peak and signal-background detectors. This means that the limiting amplifier waits that the decision threshold is completely defined before taking the decision.

In order to function correctly, the first bit of the data stream should be a one. This is the case in the ATM-PON standard, since each burst begins with a preamble of a few bits. The capacitors C1 and C2 and the controlled-current sources I1 and I2 should be chosen as a function of bit rate, low-frequency cut-off $F_{LF}$ due to the AC-coupling at the input, and/or maximum allowed data-dependent jitter at the output.

Figure 9:
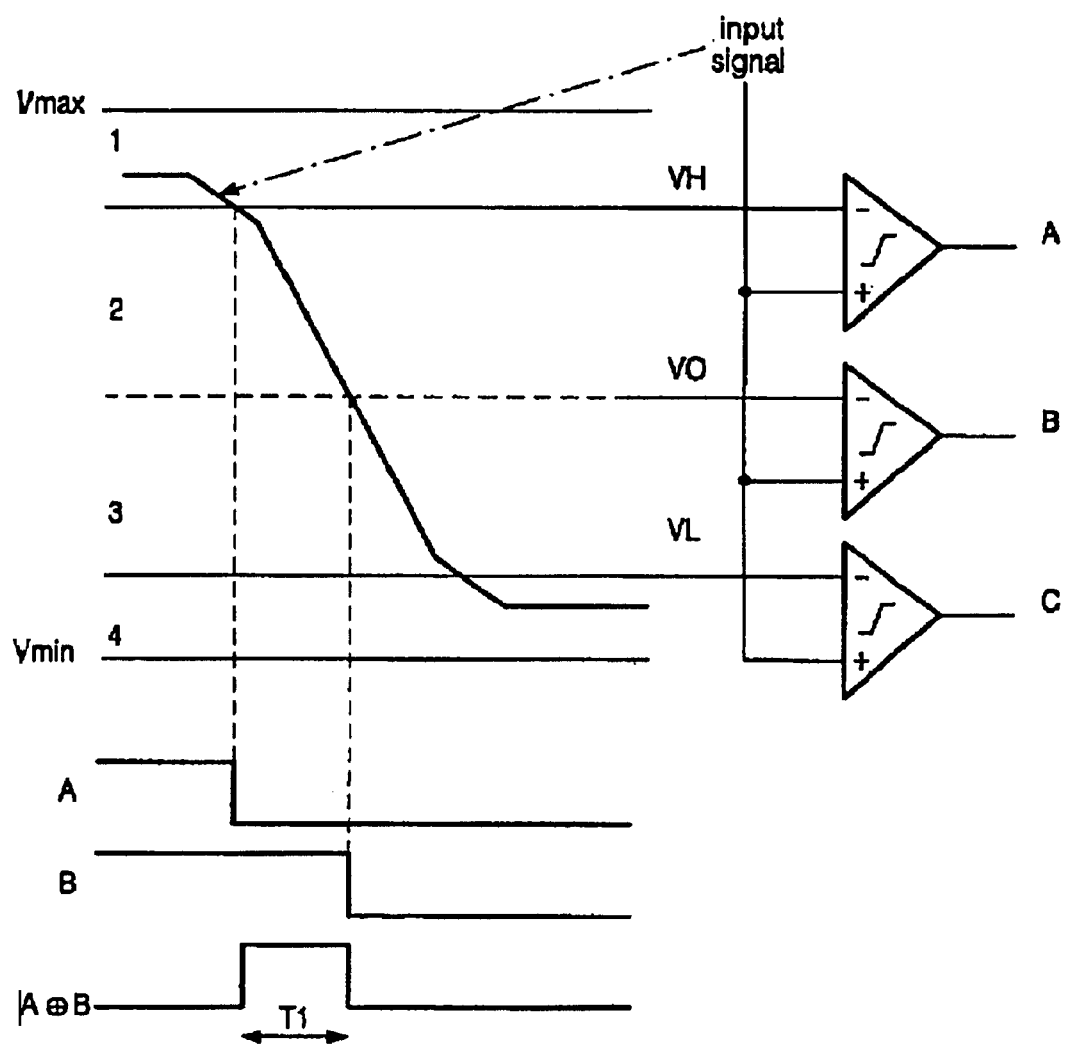
FIG. 9 shows a similar diagram as FIG. 7 with the effect of the input signal rise/fall time on the control signal A⊕B.

In FIG. 9 a data transition is shown. Because of the finite fall-time (rise-time) of the input signal, the EXOR gate GA1 will generate a short pulse TI. During this short pulse, the capacitor C1 will be discharged. This signal-peak drop $V_{drop}$ can no longer be compensated, but introduces a small shift in the transition causing jitter:

$$\tau_j^p[UI] = \frac{V_{drop}}{2} \frac{t_f}{0.6 v^{pp}} \qquad (12)$$

This jitter can be expressed as a function of the capacitance $C_1$ of the first capacitor C1 and the current $I_1$, generated by the first current source I1:

$$\tau_j^p[UI] = 0.0416 \frac{I_1}{C_1} \frac{1}{Bv^{pp}} \qquad (13)$$

If the specified jitter is $\tau^p_{j,max}[UI]$, the ratio $C_1/I_1$ ($C_2/I_2$) should be:

$$\frac{C_1}{I_1} > \frac{0.0416}{Bv^{pp}\tau^p_{j,max}[UI]} \qquad (14)$$

The propagation delay $T_d$ in LA1 and a GA1 as well as in LA3 and GA2 could limit the jitter performance of the proposed circuit. This jitter can be expressed as:

$$\tau^p_j[UI] = 0.55\pi T_d F_{LF} \qquad (15)$$

It does not depend on the bit rate B. It depends only on the propagation delay $T_d$ and the low frequency cut-off $F_{LF}$. It is important to use fast-logic and low frequency cut-off $F_{LF}$ in order to keep this jitter small. If the maximum jitter $\tau^p_{j,max}$ and the delay $T_d$ are known, the low-frequency cutoff should be limited to:

$$F_{LF} < \frac{\tau^p_{j,max}}{0.55\pi T_d} \qquad (16)$$

Figure 10:
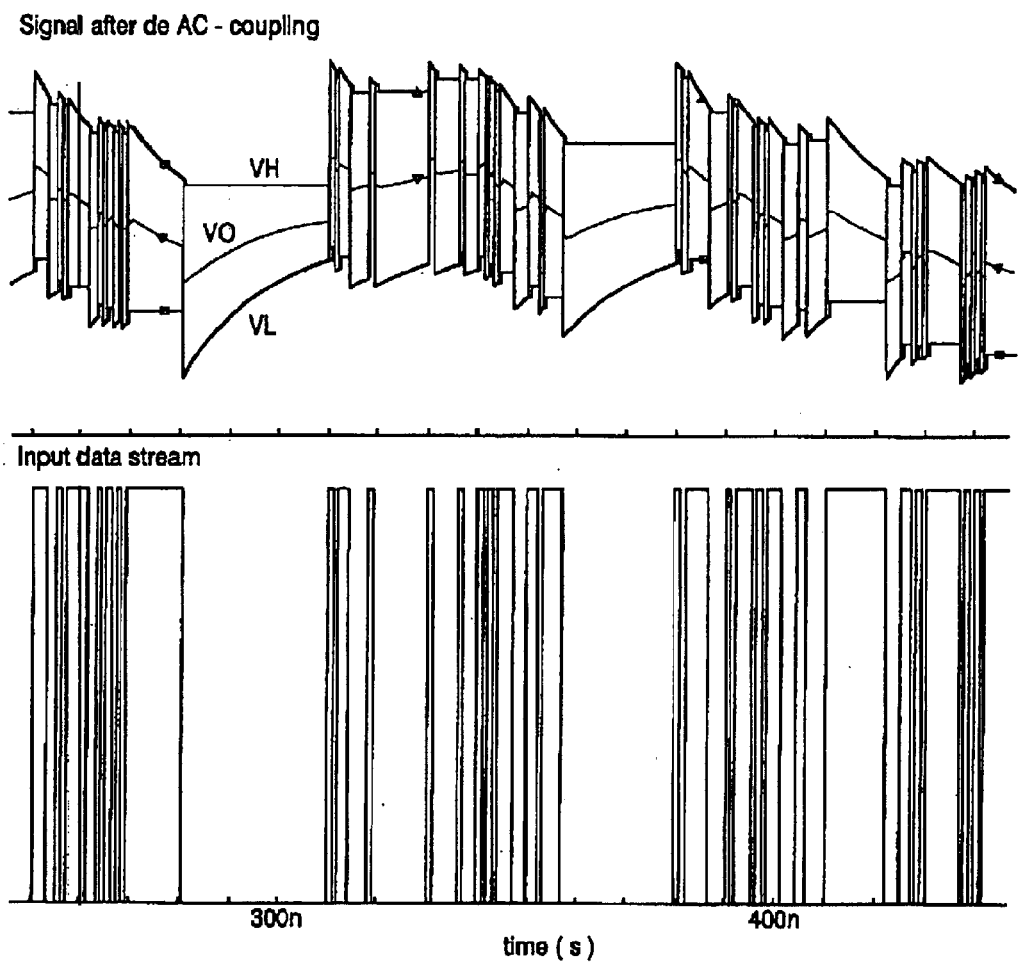
FIG. 10 shows the waveforms of the decision thresholds VH, V0 and VL as well as of the data stream at the input of a high-pass filter.

FIG. 10 shows an input data stream at the input and at the output of a high-pass filter. The corresponding decision thresholds VH, V0, and VL are shown as well.

Figure 11:
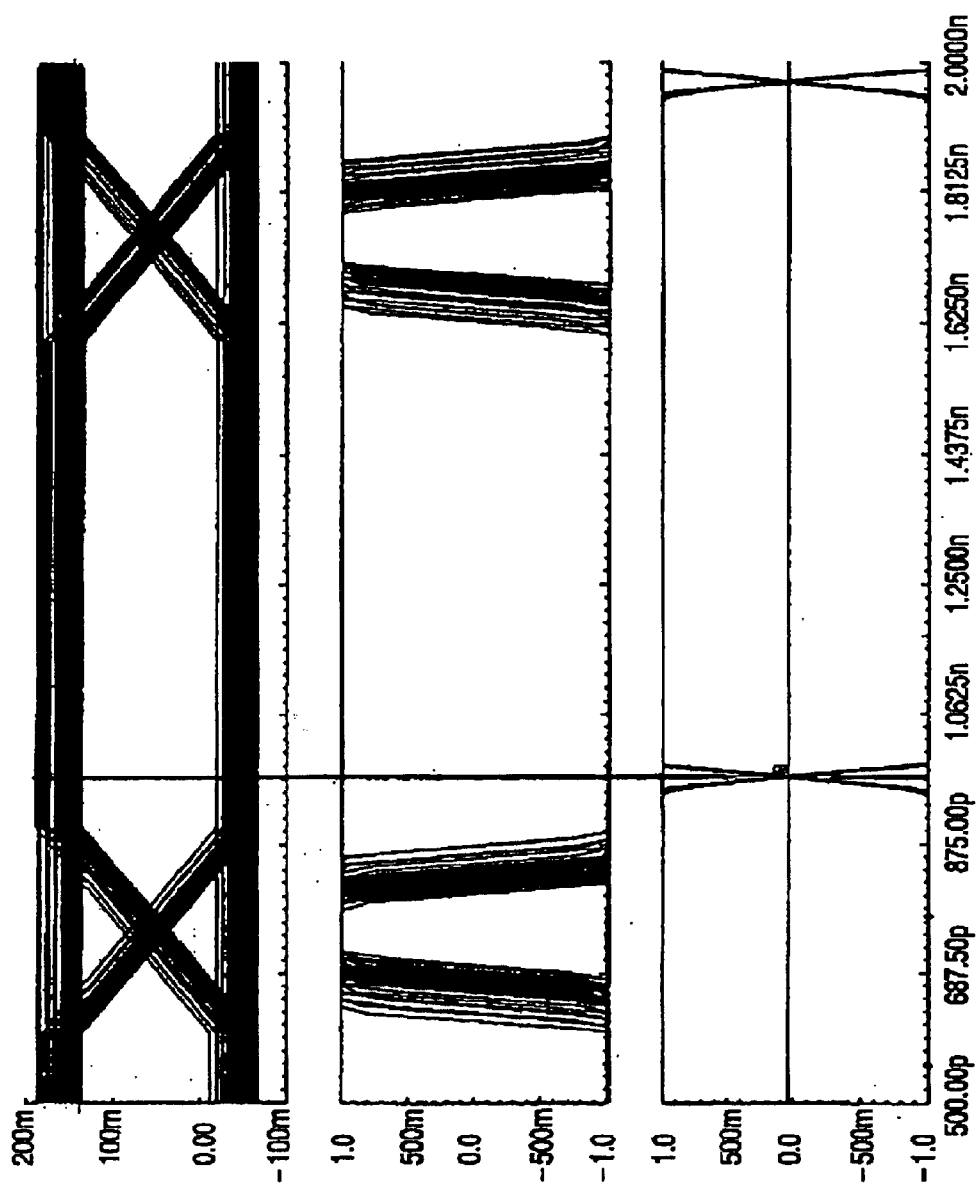
FIG. 11 shows the waveforms of signals applied to a fixed decision threshold limiting amplifier and to an adaptive decision threshold limiting amplifier for comparison purposes.

In FIG. 11 are shown for comparison purposes an eye diagram /Vin of an NRZ-signal suffering from DC-wander, an eye diagram /Vout_0 at the output of a limiting amplifier with a fixed decision threshold and having signal /Vin at its input wherein the signal Vout_0 suffers from jitter and DCD, and an eye diagram, /Vout at the output of the proposed limiting amplifier having signal /Vin at its input. We see a significant improvement in peak-to-peak jitter and DCD when adaptive decision threshold is used in order to cope with DC-wander.

Figure 12:
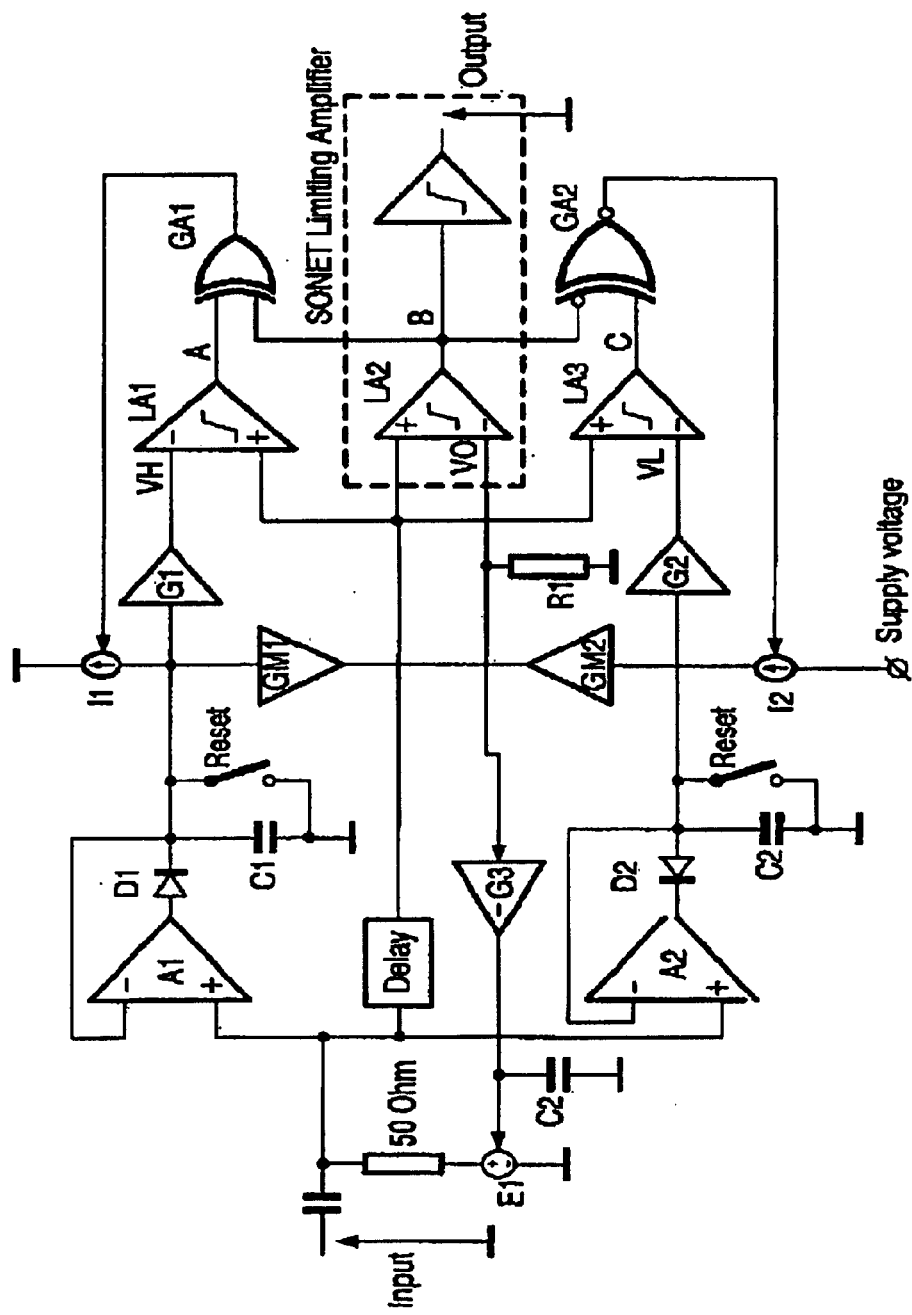
FIG. 12 shows the circuit of a limiting amplifier according to a second embodiment of the present invention.

If the input signal, in addition to DC-wander, suffers also from large amplitude variations, the common-mode range in the previous circuit may not be sufficient. In this case, an extra adaptive biasing loop should be added to the circuit of FIG. 8 as shown in FIG. 12. In this configuration, the common-mode voltage at the input is made signal independent. This is achieved by continuously subtracting the signal average from the input by means of a controlled voltage source E1. This additional loop is only provided to compensate for the slow variations of the input signal. Also, two switches "Reset" have been added in order to reset the signal-peak and signal-bottom detectors at the beginning of each burst. The reset pulse is provided by a protocol. Although the invention is described above with reference to examples shown in the attached drawings, it is apparent that the invention is not restricted to it, but can vary in many ways within the scope disclosed in the attached claims.

What is claimed is:

1. A limiting amplifier for amplifying an input signal including at least first portions having a first amplitude and second portions having a second amplitude being lower than said first amplitude, in particular digital signals comprising "one" and "zero" portions wherein the first portions are the "one" portions and the second portions are the "zero" portions, said amplifier comprising:

a first peak detecting means for detecting the current maximum value in the input signal, said first peak detecting means comprising:

first holding means for storing the currently detected maximum value if it is higher than the previous stored value and decreasing means for decreasing the stored value in said first holding means if said first amplitude is lower than said stored value, and a second peak detecting means for detecting the current minimum value in the input signal, said second peak detecting means comprising second holding means for storing the detected minimum value if it is lower than the previously stored value and increasing means for increasing the stored value in said second holding means if said second amplitude is higher than said stored value;

determining means for providing a first decision that a variation in the input signal is due to a variation in said first amplitude and/or second amplitude, or a second decision that a variation in the input signal is due to a transition from a first portion to a second portion, or a third decision that a variation in the input signal is due to a transition from a second portion to a first portion; and controlling means for inactivating said decreasing means and said increasing means if said determining means provides said first decision, for activating said decreasing means if said determining means provides said second decision, or for activating said increasing means if said determining means provides said third decision.

2. The amplifier according to claim 1, wherein said first holding means comprises a first capacitor; and said decreasing means is provided for discharging said first capacitor.

3. The amplifier according to claim 2, wherein said decreasing means comprises a first current source connected in parallel to said first capacitor.

4. The amplifier according to claim 1, wherein said second holding means comprises a second capacitor; and said increasing means is provided for charging said second capacitor.

5. The amplifier according to claim 4, characterized in that said increasing means comprises a second current source connected in series to said second capacitor.

6. The amplifier according to claim 1, wherein a threshold generating means is provided for generating a first threshold value, a second threshold value and a third threshold value, wherein said first threshold value is higher than said second threshold value and said second threshold value is higher than said third threshold value; and said determining means provides said first decision if the current value of the input signal is higher than said first threshold value or lower than said third threshold value, or said second decision if the current value of the input signal is lower than said first threshold value and higher than said second threshold value, or said third decision if the current value of the input signal is lower than said second threshold value and higher than said third threshold value.

7. The amplifier according to claim 6, wherein said threshold generating means is provided for, in particular continuously, adapting the first, second and/or third threshold values in accordance with the results of said first and second peak detecting means.

8. The amplifier according to claim 6, wherein said threshold generating means is provided for generating said first threshold value $V_H$, said second threshold value $V_0$, and said-third threshold value $V_L$ as function of the value $V_p$ stored in said first holding means and the value $V_b$ stored in said second holding means as follows:

$$V_H = \beta V_p; \frac{V_0}{V_p} < \beta < 1 \quad (10)$$

$$V_L = \gamma V_b; 1 < \gamma < \frac{V_0}{V_b} \quad (11)$$

wherein $\alpha$, $\beta$ and $\gamma$ are constants which are chosen as function of the noise in said first and second portions of the input signal.

9. A method for amplifying an input signal including at least first portions having a first amplitude and second portions having a second amplitude being lower than said first amplitude, in particular digital signals comprising "one" and "zero" portions wherein the first portions are the "one" portions and the second portions are the "zero" portions, said method comprising the steps of detecting the current maximum value in the input signal wherein the currently detected maximum value is stored if it is higher than the previous stored value and said stored value is decreased if said first amplitude is lower than said stored value, and detecting the current minimum value in the input signal wherein the detected minimum value is stored if it is lower than the previously stored value and said stored value is increased if said second amplitude is higher than said stored value;

providing a first decision that a variation in the input signal is due to a variation in said first amplitude and/or second amplitude, or a second decision that a variation in the input signal is due to a transition from a first portion to a second portion, or a third decision that a variation in the input signal is due to a transition from a second portion to a first portion; and inactivating said decreasing means and said increasing means if said determining means provides said first decision, activating said decreasing means if said determining means provides said second decision, or activating said increasing means if said determining means provides said third decision.

10. The method according to claim 9, comprising the further steps of generating a first threshold value, a second threshold value and a third threshold value, wherein said first threshold value is higher than said second threshold value and said second threshold value is higher than said third threshold value; and providing said first decision if the current value of the input signal is higher than said first threshold value or lower than said third threshold value, or said second decision if the current value of the input signal is lower than said first threshold value and higher than said second threshold value, or said third decision if the current value of the input signal is lower than said second threshold value and higher than said third threshold value.

11. The method according to claim 10, wherein in said threshold generating steps the first, second and/or third threshold values are, in particular continuously, adapted in accordance with the results of said detecting steps.

12. The method according to claim 10, wherein in said threshold generating steps said first threshold value $V_H$, said second threshold value $V_0$, and said third threshold value $V_L$ are generated as function of the value $V_p$ stored in said maximum value detecting step and the value $V_b$ stored in said minimum value detecting step as follows:

$$V_H = \beta V_p; \frac{V_0}{V_p} < \beta < 1 \tag{10}$$

$$V_L = \gamma V_b; 1 < \gamma < \frac{V_0}{V_b} \tag{11}$$

wherein $\alpha$, $\beta$ and $\gamma$ are constants which are chosen as function of the noise in said first and second portions of the input signal.

* * * * *